US012593546B2

(12) United States Patent
Yu

(10) Patent No.: US 12,593,546 B2
(45) Date of Patent: Mar. 31, 2026

(54) DISPLAY DEVICE HAVING SPACERS ON LIGHT-EMITTING ELEMENTS AND MANUFACTURING METHOD THEREOF

(71) Applicant: InnoLux Corporation, Miao-Li County (TW)

(72) Inventor: Shu-Han Yu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 519 days.

(21) Appl. No.: 18/096,027

(22) Filed: Jan. 12, 2023

(65) Prior Publication Data

US 2023/0268472 A1 Aug. 24, 2023

(30) Foreign Application Priority Data

Feb. 22, 2022 (CN) .......................... 202210162121.0

(51) Int. Cl.
*H10H 20/855* (2025.01)
*H01L 25/075* (2006.01)
*H10H 20/01* (2025.01)

(52) U.S. Cl.
CPC ....... *H10H 20/855* (2025.01); *H01L 25/0753* (2013.01); *H10H 20/01* (2025.01); *H10H 20/0363* (2025.01)

(58) Field of Classification Search
CPC .............. H01L 25/0753; H10H 29/142; H10H 20/8513; H10K 50/11; H10K 71/50; H10K 59/8723

USPC ...................................................... 257/79, 88
See application file for complete search history.

(56) References Cited

U.S. PATENT DOCUMENTS

| | | | | |
|---|---|---|---|---|
| 2010/0314704 | A1* | 12/2010 | Matsugai | .............. H10F 39/026 |
| | | | | 257/E31.127 |
| 2020/0043976 | A1* | 2/2020 | Kim | ...................... H10H 20/856 |
| 2020/0083198 | A1 | 3/2020 | Kuo | |
| 2020/0119237 | A1 | 4/2020 | Kim | |
| 2020/0219935 | A1* | 7/2020 | Ahn | ...................... H10K 59/122 |
| 2021/0359010 | A1* | 11/2021 | Kang | ...................... H10K 59/38 |
| 2021/0366981 | A1 | 11/2021 | Yeon | |
| 2022/0079161 | A1* | 3/2022 | Sunwoo | .............. C03C 17/3405 |

FOREIGN PATENT DOCUMENTS

| | | |
|---|---|---|
| CN | 109324435 | 2/2019 |
| CN | 111508991 A | 8/2020 |

* cited by examiner

*Primary Examiner* — Eliseo Ramos Feliciano
*Assistant Examiner* — Mikka Liu
(74) *Attorney, Agent, or Firm* — Winston Hsu

(57) ABSTRACT

The present disclosure provides a display device and a manufacturing method thereof. The manufacturing method of the display device includes providing a first substrate, providing a second substrate, forming a plurality of spacers on the first substrate or the second substrate by a printing process, and attaching the first substrate and the second substrate to each other, wherein the first substrate and the second substrate are separated by the spacers. The first substrate includes a plurality of light-emitting elements, the second substrate includes a plurality of optical filter elements, and the light-emitting elements overlap the optical filter elements, respectively.

15 Claims, 10 Drawing Sheets

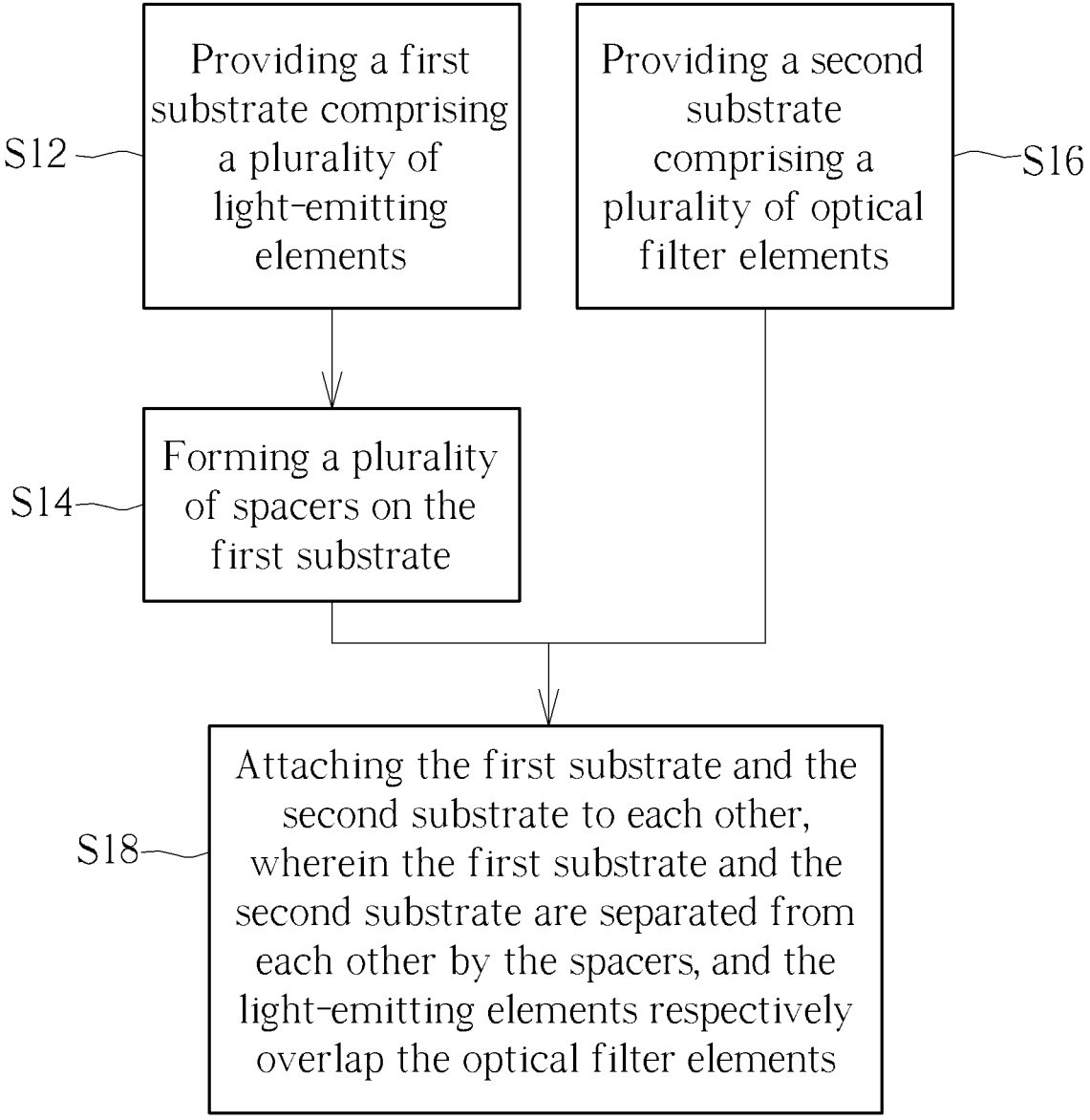

S12 — Providing a first substrate comprising a plurality of light-emitting elements S16 — Providing a second substrate comprising a plurality of optical filter elements S14 — Forming a plurality of spacers on the first substrate S18 — Attaching the first substrate and the second substrate to each other, wherein the first substrate and the second substrate are separated from each other by the spacers, and the light-emitting elements respectively overlap the optical filter elements

FIG. 2

DISPLAY DEVICE HAVING SPACERS ON LIGHT-EMITTING ELEMENTS AND MANUFACTURING METHOD THEREOF

BACKGROUND OF THE DISCLOSURE

1. Field of the Disclosure

The present disclosure relates to a display device and a manufacturing method thereof.

2. Description of the Prior Art

With the increasing convenience of electronic devices, they have become necessary tools in people's life. However, in the conventional self-luminous electronic devices, there are still problems related to display quality. Especially, although the electronic device can directly display images through light-emitting elements, there are other layer elements disposed on the light-emitting elements. Therefore, when the uniformity of the layer elements is not good, the display quality is easily affected by the layer elements on the light-emitting elements, which results in uneven image brightness.

SUMMARY OF THE DISCLOSURE

According to some embodiments, the present disclosure discloses a manufacturing method of a display device. The manufacturing method includes providing a first substrate, providing a second substrate, forming a plurality of spacers on the first substrate or the second substrate through a printing process, and attaching the first substrate and the second substrate to each other, wherein the first substrate and the second substrate are separated from each other by the spacers. The first substrate includes a plurality of light-emitting elements, the second substrate includes a plurality of optical filter elements, and the light-emitting elements respectively overlap the optical filter elements.

According to some embodiments, the present disclosure discloses a display device. The display device includes a first substrate, a second substrate, an adhesive material, and a plurality of spacers. The first substrate includes a plurality of light-emitting elements, the second substrate includes a plurality of optical filter elements, and the optical filter elements respectively overlap the light-emitting elements. The adhesive material is disposed between the first substrate and the second substrate, and the spacers are respectively disposed on multiple light-emitting elements, such that the first substrate and the second substrate are separated by the spacers.

According to some embodiments, the present disclosure discloses a display device. The display device includes a first substrate, a second substrate, a plurality of spacers, and an adhesive material. The first substrate includes a plurality of light-emitting elements, the second substrate includes a plurality of optical filter elements, and the optical filter elements respectively overlap the light-emitting elements. The spacers are disposed between the first substrate and the second substrate, and the adhesive material is disposed between the first substrate and the second substrate. One of the spacers has a maximum height and a maximum width, and at least one of the maximum height and the maximum width ranges from 0.1 μm to 300 μm.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 2 is a flowchart of a manufacturing method of a display device according to some embodiments of the present disclosure.

DETAILED DESCRIPTION

Figure 1:
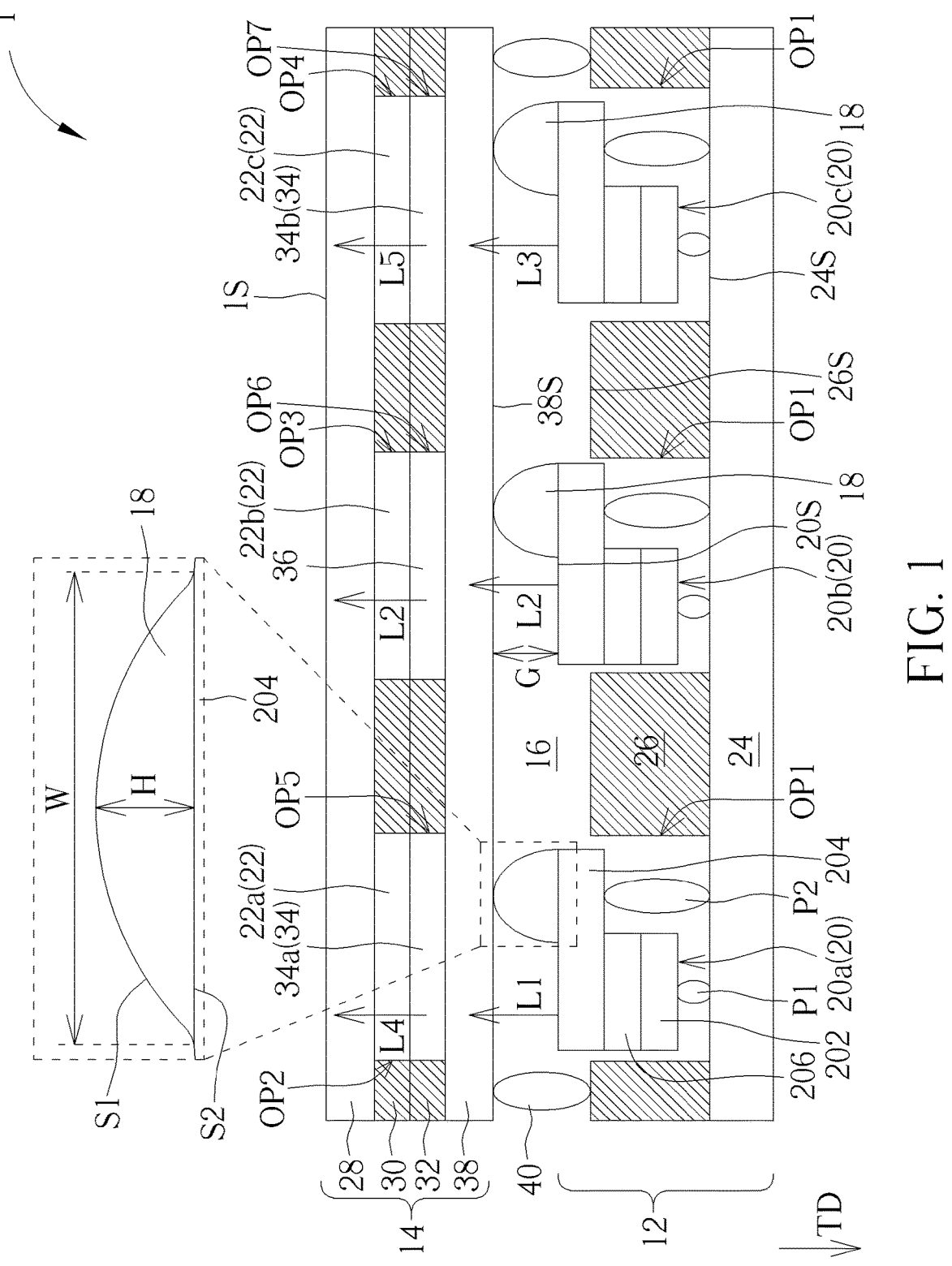
FIG. 1 is a schematic diagram illustrating a cross-sectional view of a display device according to a first embodiment of the present disclosure.

The contents of the present disclosure will be described in detail with reference to specific embodiments and drawings. It is noted that, for purposes of illustrative clarity and being easily understood by the readers, the following drawings may be simplified schematic diagrams, and elements therein may not be drawn to scale. The numbers and sizes of the elements in the drawings are just illustrative and are not intended to limit the scope of the present disclosure.

Certain terms are used throughout the specification and following claims to refer to particular elements. Those skilled in the art should understand that electronic equipment manufacturers may refer to an element by different names. This document does not intend to distinguish between elements that differ in name but not function. In the following description and claims, the terms "include", "comprise" and "have" are used in an open-ended fashion, and thus should be interpreted to mean "include, but not limited to . . . ".

Ordinal numbers such as "first" and "second" in the specification and claim are used to modify the elements in the claim. It does not mean that the element has any previous ordinal numbers, nor does it mean the order of a certain element and another element, or the order in manufacturing method. The ordinal number is just used to make a claimed element with a certain name be clearly distinguishable from another claimed element with the same name. Therefore, a first element mentioned in the specification may be referred to as a second element in the claim.

Spatially relative terms, such as "above", "on", "left", "right", "front", "behind" and the like, used in the following embodiments just refer to the directions in the drawings and are not intended to limit the present disclosure. It should be understood that the elements in the drawings may be disposed in any kind of formation known by one skilled in the related art to describe the elements in a certain way. In the specification, when one element overlaps the other element, it should be understood that the element may partially or completely overlap another.

In addition, when an element or layer is described as being on or above another element or layer, it should be understood that the element or layer is directly on the another element or layer, and alternatively, another element or layer may be between the element or layer and the another element or layer (indirectly). On the contrary, when the element or layer is described as being directly on the another element or layer, it should be understood that there is no intervening element or layer between them.

When an element is electrically connected or coupled to another element, it may include the case that there may be other elements between the element and the another element to electrically connect them or the case that the element and the another element are directly electrically connected without another element. When the element is directly electrically connected or directly coupled to the another element, it means that there is no other element between the element and the another element, and the element is directly electrically connected to the another element.

In the specification, the terms "approximately", "about", "substantially", "roughly", and "same" generally mean within 10%, 5%, 3%, 2%, 1%, or 0.5% of the reported numerical value or range. The quantity disclosed herein is an approximate quantity, that is, without a specific description of "approximately", "about", "substantially", "roughly", and "same", the quantity may still include the meaning of "approximately", "about", "substantially", "roughly", and "same".

It should be understood that according to the following embodiments, technical features in different embodiments may be replaced, recombined, or mixed to constitute other embodiments without departing from the spirit of the present disclosure. The technical features of various embodiments may be mixed arbitrarily and used in different embodiments without departing from the spirit of the present disclosure or conflicting.

In the present disclosure, the length, width, thickness, height or area, or the distance or spacing between elements may be measured by optical microscopy (OM), scanning electron microscope (SEM), a thin film thickness and surface profile gauge ($\alpha$-step), an ellipsometer, or other suitable methods, but not limited thereto. Specifically, according to some embodiments, a scanning electron microscope can be used to obtain an image of the cross-sectional structure of the element to be measured, and the length, width, thickness, height or area of each element, or the distance or spacing between elements may be measured, but it is not limited thereto. In addition, any two values or directions used for comparison may have certain errors.

Unless otherwise defined, all terms (including technical and scientific terms) used herein have the same meaning as commonly understood by those skilled in the art to which the present disclosure belongs. It can be understood that these terms, such as those defined in commonly used dictionaries, should be interpreted as having the meaning consistent with the related art and the background or context of the present disclosure, and should not be interpreted in an ideal or overly formal way, unless specifically defined in the embodiments of the present disclosure.

In the present disclosure, the display device may optionally include light sensing, image sensing, touch, antenna, other suitable functions or a combination of the above functions, but it is not limited thereto. The display device may be a bendable, flexible or stretchable display device. In some embodiments, the display device may include a tiled device, but it is not limited thereto. The display device may include a light-emitting diode (LED), a quantum dot (QD) material, a fluorescent material, a phosphor material, other suitable materials or a combination of any two of the above, but it is not limited thereto. The light-emitting diode may include, for example, an organic light-emitting diode (OLED), a micro-LED, a mini-LED or a quantum dot light-emitting diode (QLED or QDLED), but it is not limited thereto. In addition, the display device may be, for example, a color display device, a monochrome display device or a grayscale display device. The display device may be, for example, in a shape of rectangular, circular, polygonal, a shape with curved edges, a curved surface, or other suitable shapes. The display device may optionally have a peripheral system such as a drive system, a control system, a light source system, a shelf system, etc.

Please refer to FIG. 1, which is a schematic cross-sectional view of a display device according to a first embodiment of the present disclosure. In order to clearly show main features of the present disclosure, the drawings in the specification show cross-sectional views of portions of the display devices, but not limited thereto. As shown in FIG. 1, the display device 1 may include a first substrate 12, a second substrate 14, an adhesive material 16 and a plurality of spacers 18. The first substrate 12 may include a plurality of light-emitting elements 20, the second substrate 14 may include a plurality of optical filter elements 22, and the optical filter elements 22 may respectively overlap the light-emitting elements 20 along a top view direction TD. The adhesive material 16 and the spacers 18 may be disposed between the first substrate 12 and the second substrate 14, such that the first substrate 12 and the second substrate 14 may be separated from each other by the spacers 18. Through the disposition of the spacers 18, a distance G (i.e., cell gap) between the first substrate 12 and the second substrate 14 may be uniformized, thereby reducing the unevenness of image brightness (mura), or improving the display quality.

In the embodiment of FIG. 1, the first substrate 12 may further include a circuit substrate 24, and the light-emitting elements 20 may be disposed on the circuit substrate 24, wherein the circuit substrate 24 may be used to control switches of the light-emitting elements 20 and the brightness of the light-emitting elements 20, such that the display device 1 displays images. Although not shown in FIG. 1, the circuit substrate 24 may include, for example, a substrate and a circuit layer. The substrate may include, for example, a flexible substrate or an inflexible substrate. The material of the substrate may include, for example, glass, ceramic, quartz, sapphire, acrylic, polyimide (PI), polyethylene terephthalate (PET), polycarbonate (PC), other suitable materials or a combination of the above, but not limited thereto. The circuit layer may include, for example, a plurality of pixel circuits and a plurality of signal lines. For example, one of the pixel circuits may include a 2T1C type pixel circuit (including two thin film transistors and one capacitor), a 7T2C type pixel circuit (including seven thin film transistors and two capacitors), a 7T3C type pixel circuit (including seven thin film transistors and three capacitors), a 3T1C type pixel circuit (including three thin film transistors and one capacitor), a 3T2C type pixel circuit (including three thin film transistors and two capacitors), but it is not limited thereto. The signal line may include, for example, a data line, a scan line and a power line, but not limited thereto. In some embodiments, the circuit layer may further include a circuit, such as a scan driver and a data driver, for controlling the display device 1, but not limited thereto.

As shown in FIG. 1, the light-emitting elements 20 may include a light-emitting element 20a, a light-emitting element 20b, and a light-emitting element 20c for respectively generating light L1, light L2, and light L3, and the optical filter elements 22 may include an optical filter element 22a, an optical filter element 22b, and an optical filter element 22c respectively overlapping the light-emitting element 20a, the light-emitting element 20b, and the light-emitting element 20c. In the embodiment of FIG. 1, the light-emitting element 20a, the light-emitting element 20b and the light-emitting element 20c may be, for example, the same as each other, and the light L1, the light L2 and the light L3 may have the same color, such as blue light, light with a wavelength smaller than blue light, white light or other suitable colors, but it is not limited thereto. In some embodiments, at least two of the light L1, the light L2 and the light L3 may have the same color. In some embodiments, the light L1, the light L2 and the light L3 may have different colors from each other, but not limited thereto. The number of the light-emitting element 20a, the number of the light-emitting element 20b, the number of the light-emitting element 20c, the number of the optical filter element 22a, the number of the optical filter element 22b and the number of the optical filter element 22c are not limited to be one as shown in FIG. 1 and may be more than one.

As shown in FIG. 1, one of the light-emitting elements 20 may include, for example, a P-type semiconductor layer 202, an N-type semiconductor layer 204, and a light-emitting layer 206 disposed between the P-type semiconductor layer 202 and the N-type semiconductor layer 204. The light-emitting layer 206 may include, for example, a multi-quantum well (MQW) layer or other suitable layers. The light-emitting element 20 may further include, for example, a connection terminal P1 and a connection terminal P2, wherein the connection terminal P1 is disposed on a surface of the P-type semiconductor layer 202 facing the circuit substrate 24, and the connection terminal P2 is disposed on a surface of the N-type semiconductor layer 204 facing the circuit substrate 24. The connection terminal P1 and the connection terminal P2 of the light-emitting element 20 may be bonded and electrically connected to the circuit substrate 24, for example, by a flip-chip method. The connection terminal P1 and the connection terminal P2 may include, for example, pads, bumps and/or other suitable connection structures. In the embodiment of FIG. 1, the light-emitting layer 206 is disposed between the P-type semiconductor layer 202 and the N-type semiconductor layer 204, and the P-type semiconductor layer 202 is disposed between the light-emitting layer 206 and the circuit substrate 24. In this case, an area of the N-type semiconductor layer 204 may be greater than that of the P-type semiconductor layer 202 when viewed along the top view direction TD of the display device 1. In some embodiments, positions of the P-type semiconductor layer 202 and the N-type semiconductor layer 204 may be interchangeable, that is, the light-emitting layer 206 may be disposed between the P-type semiconductor layer 202 and the N-type semiconductor layer 204, and the N-type semiconductor layer 204 is disposed between the light-emitting layer 206 and the circuit substrate 24. In such case, the area of the P-type semiconductor layer 202 may be greater than that of the N-type semiconductor layer 204. The top view direction TD of the display device 1 may be, for example, a direction perpendicular to the display surface 1S of the display device 1, but not limited thereto.

In the embodiment of FIG. 1, the first substrate 12 may optionally further include a light-shielding layer 26 disposed on the circuit substrate 24. The light-shielding layer 26 may include a plurality of openings OP1 for accommodating the light-emitting elements 20. For example, the light-shielding layer 26 may be used as a pixel definition layer, such that a region of one of the openings OP1 may be used to define one pixel or sub-pixel of the display device 1 when viewed along the top view direction TD, but not limited thereto. The light-shielding layer 26 may include, for example, a light-shielding material, wherein the light-shielding material may include, for example, a photoresist material, an ink material, a pigment, a dye or other suitable materials. In some embodiments, a height of an upper surface 26S of the light-shielding layer 26 may be lower than or higher than a height of an upper surface 20S of one of the light-emitting elements 20 facing the second substrate 14. The "height" mentioned herein may refer to a distance calculated based on the same horizontal plane. For example, the height of the upper surface 26S of the light-shielding layer 26 may be a distance between the upper surface 26S and an upper surface 24S of the circuit substrate 24, and the height of the upper surface 20S of the light-emitting element 20 may be a distance between the upper surface 20S of the N-type semiconductor layer 204 and the upper surface 24S of the circuit substrate 24.

As shown in FIG. 1, the second substrate 14 may further include a transparent substrate 28 and a light-shielding layer 30. The transparent substrate 28 may include, for example, a flexible substrate or an inflexible substrate. The material of the transparent substrate 28 may include, for example, glass, ceramic, quartz, sapphire, acrylic, polyimide, polyethylene terephthalate, polycarbonate, other suitable materials or a combination of the above, but not limited thereto. The light-shielding layer 30 may be disposed on a surface of the transparent substrate 28 facing the first substrate 12 and may have an opening OP2, an opening OP3 and an opening OP4 for accommodating the optical filter elements 22. The number of opening OP2, the number of opening OP3, and the number of opening OP4 are not limited to be one as shown in FIG. 1 and may be more than one. The light-shielding layer 30 may include, for example, a light-shielding material, wherein the light-shielding material may include, for example, a photoresist material, an ink material, a pigment, a dye or other suitable materials. The optical filter element 22a, the optical filter element 22b, and the optical filter element 22c may be respectively disposed in the opening OP2, the opening OP3, and the opening OP4. One of the optical filter elements 22 may include, for example, a color filter or other suitable filter elements, but not limited thereto. For example, the optical filter element 22 may include a photoresist material, an ink material, a pigment, a dye or other suitable materials.

In the embodiment of FIG. 1, a color of light L2 generated by the light-emitting element 20b may be used as a color of a pixel or a sub-pixel, and the second substrate 14 may further include a light-shielding layer 32, color conversion layers 34, and a transparent filling layer 36. The light-shielding layer 32 may be, for example, disposed under the light-shielding layer 30 and may have an opening OP5, an opening OP6 and an opening OP7, which respectively overlap the opening OP2, the opening OP3 and the opening OP4 when viewed along the top view direction TD. The light-shielding layer 32 may include a light-shielding material. The color conversion layers 34 may respectively overlap the corresponding light-emitting elements 20 in the top view direction TD for converting the light generated by the corresponding light-emitting elements 20 into light with different colors. In the embodiment of FIG. 1, the color conversion layers 34 may include, for example, a color conversion layer 34a and a color conversion layer 34b, wherein the color conversion layer 34a may absorb the light L1 and generate light L4 with a color different from the light L1, and the color conversion layer 34b may absorb the light L3 and generate light L5 with a color different from the light L3. The transparent layer 36 does not absorb the light L2 and allows the light L2 to pass through.

Specifically, as shown in FIG. 1, the color conversion layer 34a and the color conversion layer 34b may be respectively disposed in the opening OP5 and the opening OP7, and the transparent filling layer 36 may be disposed in the opening OP6, such that the color conversion layer 34a, the transparent filling layer 36 and the color conversion layer 34b may respectively overlap the optical filter element 22a, the optical filter element 22b and the optical filter element 22c along the top view direction TD. In this case, the light L4 generated by the color conversion layer 34a and the light L5 generated by the color conversion layer 34b may respectively be directed to the optical filter element 22a and the optical filter element 22c, and the light L2 passing through the transparent filling layer 36 may be directed to the optical filter element 22b. The optical filter element 22a, the optical filter element 22b and the optical filter element 22c may be, for example, color filters with different colors. For example, the color of the optical filter element 22a may be the same as or close to the color of the light L4, the color of the optical filter element 22c may be the same as or close to the color of the light L5, and the color of the optical filter element 22b may be the same as or close to the color of the light L2. Therefore, the light L4, the light L5 and the light L2 may respectively pass through the optical filter element 22a, the optical filter element 22c and the optical filter element 22b and then be respectively emitted from the display surface 1S of the display device 1, so as to be the lights generated by different sub-pixels of the same pixel of the display device 1 (or the lights generated by different pixels). For example, wavelengths corresponding to the maximum light intensity peaks of the light L1 and the light L3 may be respectively less than the wavelengths corresponding to the maximum light intensity peaks of the light L4 and the light L5. The light L4, the light L2 and the light L5 may be, for example, mixed to be a white light. For example, the light L4, the light L2 and the light L5 may be a red light, a blue light and a green light respectively, and the optical filter element 22a, the optical filter element 22b and the optical filter element 22c may be a red filter, a blue filter and a green filter respectively, but not limited thereto. In some embodiments, the colors of the optical filter element 22a, the optical filter element 22b, and the optical filter element 22c may be adjusted according to the colors of the light L4, the light L2, and the light L5 respectively, but not limited thereto. In some embodiments, the color conversion layer 34a and the color conversion layer 34b may include, for example, a fluorescent material, a phosphorescent material, quantum dot particles, or other light conversion materials that is able to convert the color of light.

It is worth noting that, since the optical filter element 22a may block (absorb or reflect) at least a portion of light with a color different from that of the light L4, the optical filter element 22b may block (absorb or reflect) at least a portion of light with a color different from that of the light L2, and the optical filter element 22c may block (absorb or reflect) at least a portion of light with a color different from that of the light L5, the colors of the light L4, the light L2 and the light L5 passing through the optical filter element 22a, the optical filter element 22b and the optical filter element 22c and then being emitted from the display surface 1S is purified to meet requirements. In some embodiments, an arrangement order of the color conversion layer 34a, the transparent filling layer 36 and the color conversion layer 34b is not limited as FIG. 1, but may be other arrangements. The positions of optical filter element 22a, optical filter element 22b and optical filter element 22c may be designed according to the positions of color conversion layer 34a, transparent filling layer 36 and color conversion layer 34b. In some embodiments, the second substrate 14 may optionally include, for example, scattering particles (not shown in figures) disposed in the transparent filling layer 36. In some embodiments, the transparent filling layer 36 may be replaced with a color conversion layer, but not limited thereto. For example, when the color of the light L2 is not the color of one of the sub-pixels in the display device 1, the color conversion layer 34 instead of the transparent filling layer may convert the color of the light L2 into the same color as the sub-pixel. In some embodiments, the color conversion layer 34 may be replaced with the transparent filling layer 36, but it is not limited thereto. For example, when the color of light L1 or light L3 is the same as the color of one of the sub-pixels in the display device 1, the transparent filling layer 36 instead of the color conversion layer 34 may allow the light L1 or light L3 to pass through, which may be regarded as the light of the sub-pixel.

In some embodiments, as shown in FIG. 1, the second substrate 12 may optionally include an encapsulation layer 38 disposed under the light-shielding layer 32, the color conversion layer 34 and the transparent filling layer 36 to reduce or avoid damage of the color conversion layer 34 caused by moisture or oxygen. The material of the encapsulation layer 38 may include, for example, a stack of an inorganic material layer, an organic material layer and an inorganic material layer, a single inorganic material layer, a stack of multiple inorganic material layers or other suitable layers. For example, the inorganic material layer may include silicon nitride, silicon oxide, silicon oxynitride, aluminum oxide or other suitable protective materials, or any combination of the above inorganic materials, but it is not limited thereto. The organic material layer may include resin, but it is not limited thereto.

As shown in FIG. 1, the spacers 18 may be disposed between the first substrate 12 and the second substrate 14, and an upper surface S1 and a lower surface S2 of one of the spacers 18 may directly contact the second substrate 14 and the first substrate 12, respectively. Therefore, the spacers 18 are used to support a space between the first substrate 12 and the second substrate 14, such that the distance G between the first substrate 12 and the second substrate 14 may be uniformized. The distance G may be, for example, a distance between a lower surface of the second substrate 14 facing the first substrate 12 and an upper surface of the first substrate 12. In the embodiment of FIG. 1, the lower surface of the second substrate 14 may be, for example, a lower surface 38S of the encapsulation layer 38 facing the first substrate 12, and the distance G may be, for example, a distance between the lower surface 38S of the encapsulation layer 38 facing the first substrate 12 and the upper surface 20S of the light-emitting element 20 facing the second substrate 14. The distance G may be, for example, greater than 0 μm and less than 5 μm (0 μm<distance G<5 μm). For example, a difference between a maximum distance and a minimum distance between the first substrate 12 and the second substrate 14 may be less than or equal to 10% of the maximum distance or 10% of the minimum distance, such that the display device 1 has a uniform distance G.

In the embodiment of FIG. 1, the spacers 18 may be respectively disposed on a plurality of the light-emitting elements 20 and may not overlap the light-emitting layers 206. For example, one of the spacers 18 may be disposed on a portion of the N-type semiconductor layer 204 that does not overlap the light-emitting layer 206 along the top view direction TD, so as to reduce the influence of the spacer 18 on the brightness of the corresponding light-emitting element 20. In some embodiments, when the positions of the N-type semiconductor layer 204 and the P-type semiconductor layer 202 exchange, such that the N-type semiconductor layer 204 is disposed between the light-emitting layer 206 and the circuit substrate 24, and the P-type semiconductor layer 202 is disposed on the light-emitting layer 206, one of the spacers 18 may be disposed on a portion of the P-type semiconductor layer 202 that does not overlap the light-emitting layer 206 along the top view direction TD.

In some embodiments, the spacer 18 may be, for example, in a dome shape. For example, the upper surface S1 of the spacer 18 is a convex curved surface, and an edge of the upper surface S1 may be connected with the lower surface S2. In some embodiments, the spacer 18 may have a maximum height H and a maximum width W, and a ratio of the maximum width W to the maximum height H may range from, for example, about 0.3 to 8 (0.3≤W/H≤8). For example, the maximum height H may range from 0.1 μm to 300 μm or from 0.1 μm to 30 μm (0.1 μm≤maximum height H≤300 μm or 0.1 μm≤maximum height H≤30 μm), and/or the maximum width W may range from 0.1 μm to 300 μm or from 0.1 μm to 7 μm (0.1 μm≤maximum width W≤300 μm or 0.1 μm≤maximum width W≤7 μm), but not limited thereto. In some embodiments, a visible light transmittance of the spacer 18 may be, for example, greater than or equal to 90% to improve the brightness of the light of the light-emitting element 20 emitted from the display surface 1S of the display device 1. In some embodiments, a haze of the spacer 18 may be, for example, less than or equal to 1%. In the present disclosure, the haze is defined as, for example, an intensity of a transmission light passing through the spacer 18 and having an outgoing direction that deviates from an incident direction of an incident light into the spacer 18 by 2.5 degrees or more divided by a total intensity of all transmission light passing through the spacer 18 (i.e., (luminous flux of the transmission light deviating from the incident direction by 2.5 degrees or more)/(total luminous flux of all the transmission light)), but not limited thereto. In some embodiments, the compressible range of the spacer 18 may be, for example, greater than 0.15 μm or greater than 3 μm. The compressible range of the spacer 18 may be determined, for example, according to the material of the spacer 18 and the distance G of the display device 1.

As shown in FIG. 1, the display device 1 may further include a sealing layer 40 to reduce leakage of the adhesive material 16 before the adhesive material 16 is cured. The sealing layer 40 and the adhesive material 16 may be used for bonding the first substrate 12 to the second substrate 14. The sealing layer 40 may surround the adhesive material 16 to seal the adhesive material 16 between the first substrate 12 and the second substrate 14. In the embodiment of FIG. 1, the adhesive material 16 disposed between the first substrate

12 and the second substrate 14 may be disposed in the opening OP1 of the light-shielding layer 26, but not limited thereto. The sealing layer 40 may include, for example, an encapsulant material or other suitable materials.

It should be noted that, in some embodiments, because a refractive index of the N-type semiconductor layer 204 or the P-type semiconductor layer 202 is greater than that of the adhesive material 16, the design that a refractive index of the spacer 18 is greater than that of the adhesive material 16 may reduce a total reflection of the light emitted from the light-emitting element 20 that is generated between the light-emitting element 20 and the adhesive material 16, thereby improving light extraction efficiency of the light-emitting element 20. For example, the refractive index of the spacer 18 may be between the refractive index of the N-type semiconductor layer 204 or the P-type semiconductor layer 202 and the refractive index of the adhesive material 16. The N-type semiconductor layer 204 or the P-type semiconductor layer 202 may include, for example, gallium nitride or other suitable semiconductor materials. The spacer 18 may include, for example, a photosensitive resin, an ink or other suitable materials, and the photosensitive resin may be cured by ultraviolet light or other suitable means. The adhesive material 16 may include, for example, optical clear resin (OCR) or other suitable materials.

Please refer to FIG. 2 which is a flowchart of a manufacturing method of a display device according to some embodiments of the present disclosure. As shown in FIG. 2, the manufacturing method of the display device may include, for example, step S12 to step S18, and is described in detail below with references of FIG. 1 and FIG. 2. As shown in FIG. 1 and FIG. 2, in step S12, a first substrate 12 is provided. For example, step S12 of providing the first substrate 12 may include providing the circuit substrate 24, forming the light-shielding layer 26 on the circuit substrate 24, and then bonding the light-emitting elements 20 on the circuit substrate 24, but not limited thereto. After step S12, step S14 may be performed to form a plurality of spacers 18 on the first substrate 12. The spacers 18 may be formed on the light-emitting elements 20, for example, by photolithography and etching processes, a printing process or other suitable processes, wherein the printing process may include an inkjet printing process, but not limited thereto. The inkjet printing process may accurately control sizes and positions of the spacers 18 formed on the first substrate 12. When the spacers 18 are formed through the printing process, the spacers 18 may be cured after the printing process. In some embodiments, when the spacers 18 are formed by the inkjet printing process, the spacers 18 may include, for example, epoxy, acrylic, other suitable materials, or a combination of at least two of the above, but not limited thereto. When the spacers 18 include epoxy, the spacers 18 may be cured, for example, by heating. When the spacers 18 include an acrylic material, the spacers 18 may be cured, for example, by lighting (such as ultraviolet light). Alternatively, the spacers 18 may be cured by heating and lighting, but not limited thereto.

As shown in FIG. 1 and FIG. 2, in step S16, the second substrate 14 is provided. The light-shielding layer 30, the light-shielding layer 32, the optical filter element 22, the color conversion layer 34, and the encapsulation layer 38 may be respectively formed, for example, by exposure and development processes, the inkjet printing process, or other suitable processes, and required processes may be performed according to different materials, so they are not described in detail here. Since step S12 and step S14 do not affect the progress of step S16, step S12 and step S14 may be performed before or after step S16, or at least one of step S12 and step S14 may be performed simultaneously with step S16, but not limited thereto. After step S14 of forming the spacer 18 and step S16 of providing the second substrate 14, step S18 may be carried out to attach the first substrate 12 formed with the spacers 18 and the second substrate 14 to each other, wherein the first substrate 12 and the second substrate 14 are separated from each other by the spacers 18. For example, step S18 of attaching the first substrate 12 and the second substrate 14 to each other may include disposing the sealing layer 40 on the first substrate 12, such that the sealing layer 40 surrounds all the light-emitting elements 20 when viewed along the top view direction TD, disposing the adhesive material 16 in a region surrounded by the sealing layer 40, and then attaching the second substrate 14 and the first substrate 12 to each other through the sealing layer 40 and the adhesive material 16. Afterwards, the sealing layer 40 and the adhesive material 16 are cured by a curing process, such that the display device 1 is formed. It should be noted that in step S18, since the spacers 18 between the first substrate 12 and the second substrate 14 have been cured before the adhesive material 16 is cured, the spacers 18 are able to support the space between the first substrate 12 and the second substrate 14, and thus the distance G between the first substrate 12 and the second substrate 14 may be uniformized.

The display device and the manufacturing method thereof are not limited to the above embodiments, and may have different embodiments. To simplify the explanation, the reference numbers in different embodiments are named the same as those of the first embodiment to label the same elements. In order to easily compare the differences between the first embodiment and other embodiments, the differences between different embodiments are highlighted below, and the same portion is not described in detail.

Figure 3:
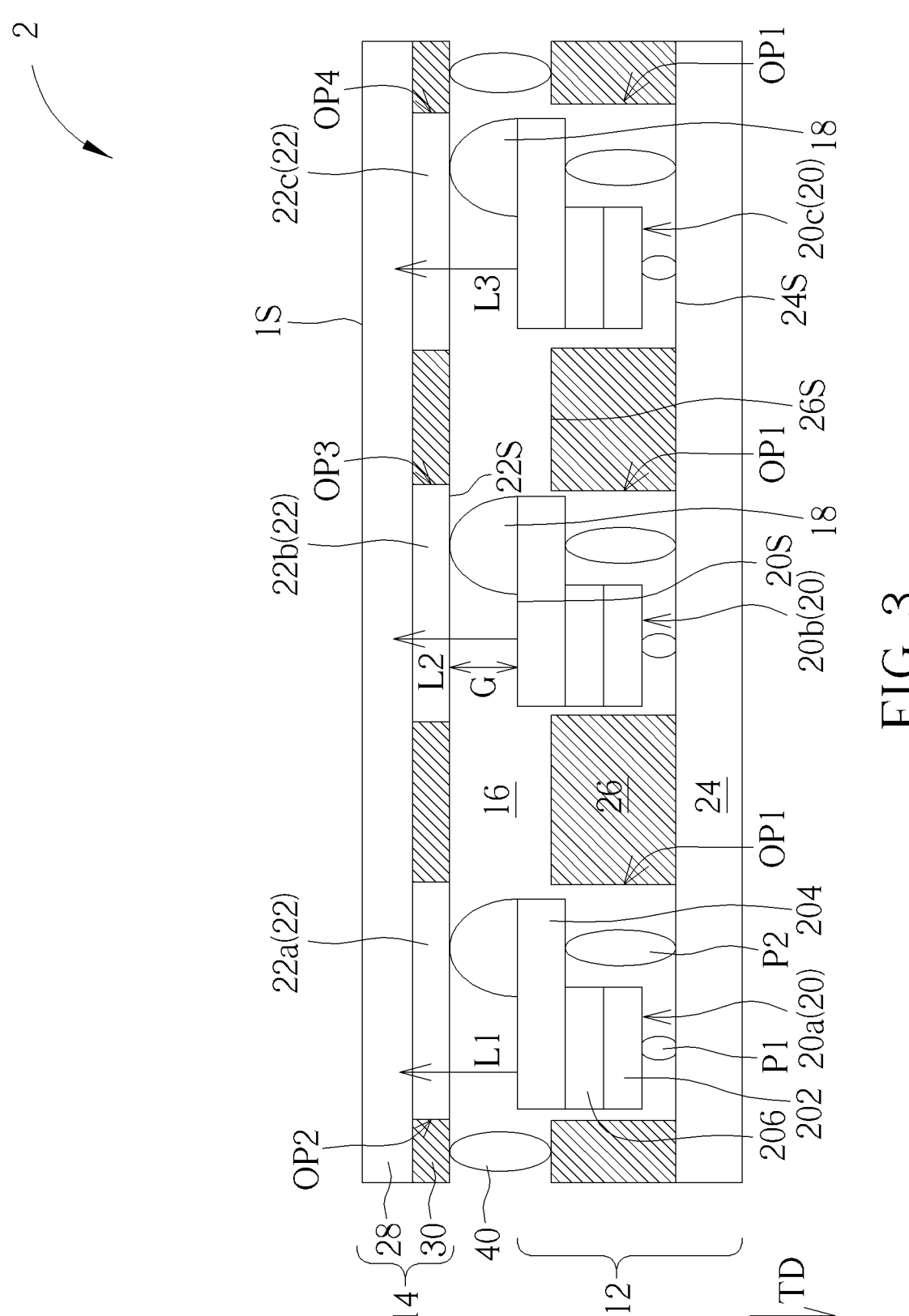
FIG. 3 is a schematic diagram illustrating a cross-sectional view of a display device according to a second embodiment of the present disclosure.

FIG. 3 is a schematic cross-sectional view of a display device according to a second embodiment of the present disclosure. As shown in FIG. 3, one of differences between the display device 2 of the present embodiment and the display device 1 shown in FIG. 1 is that the light L1 generated by the light-emitting element 20a, the light L2 generated by the light-emitting element 20b and the light L3 generated by the light-emitting element 20c of the present embodiment may have different colors. For example, the light L1, the light L2 and the light L3 may be mixed into white light, and they are, for example, red light, blue light, and green light, respectively, but not limited thereto. In this case, the second substrate 14 of the display device 2 may optionally not include the light-shielding layer 32, the color conversion layer 34 and the transparent filling layer 36 shown in FIG. 1. The light L1, the light L2 and the light L3 may respectively pass through the optical filter element 22a, the optical filter element 22b and the optical filter element 22c. It is noted that since the optical filter element 22a, the filter 22b and the filter 22c have different colors, they have different transmittances for light of different wavelength ranges. Accordingly, the optical filter element 22a, the optical filter element 22b and the optical filter element 22c may have an effect of anti-reflection, and thus interference of ambient light on the image displayed by the display device 2 may be reduced. In some embodiments, the display device 2 may optionally not include the encapsulation layer 38. In this case, the lower surface of the second substrate 14 may be, for example, a lower surface 22S of the optical filter element 22 facing the first substrate 12, and the distance G between the first substrate 12 and the second substrate 14 may be, for example, a distance between the lower surface 22S of the optical filter element 22 and the upper surface 20S of the light-emitting element 20. The distance G may be, for example, greater than 0 μm and less than 5 μm (0 μm<spacing G<5 μm). Other portions of the display device 2 shown in FIG. 3 may be, for example, the same as those of the display device 1 shown in FIG. 1, so the details are not repeated. The manufacturing method of the display device 2 shown in FIG. 3 may be similar to that shown in FIG. 2, and differences between them is that the second substrate 14 of FIG. 3 does not include the light-shielding layer 32, the color conversion layer 34 and the transparent filling layer 36. Other steps are the same as the manufacturing method shown in FIG. 1 and FIG. 2.

Figure 4:
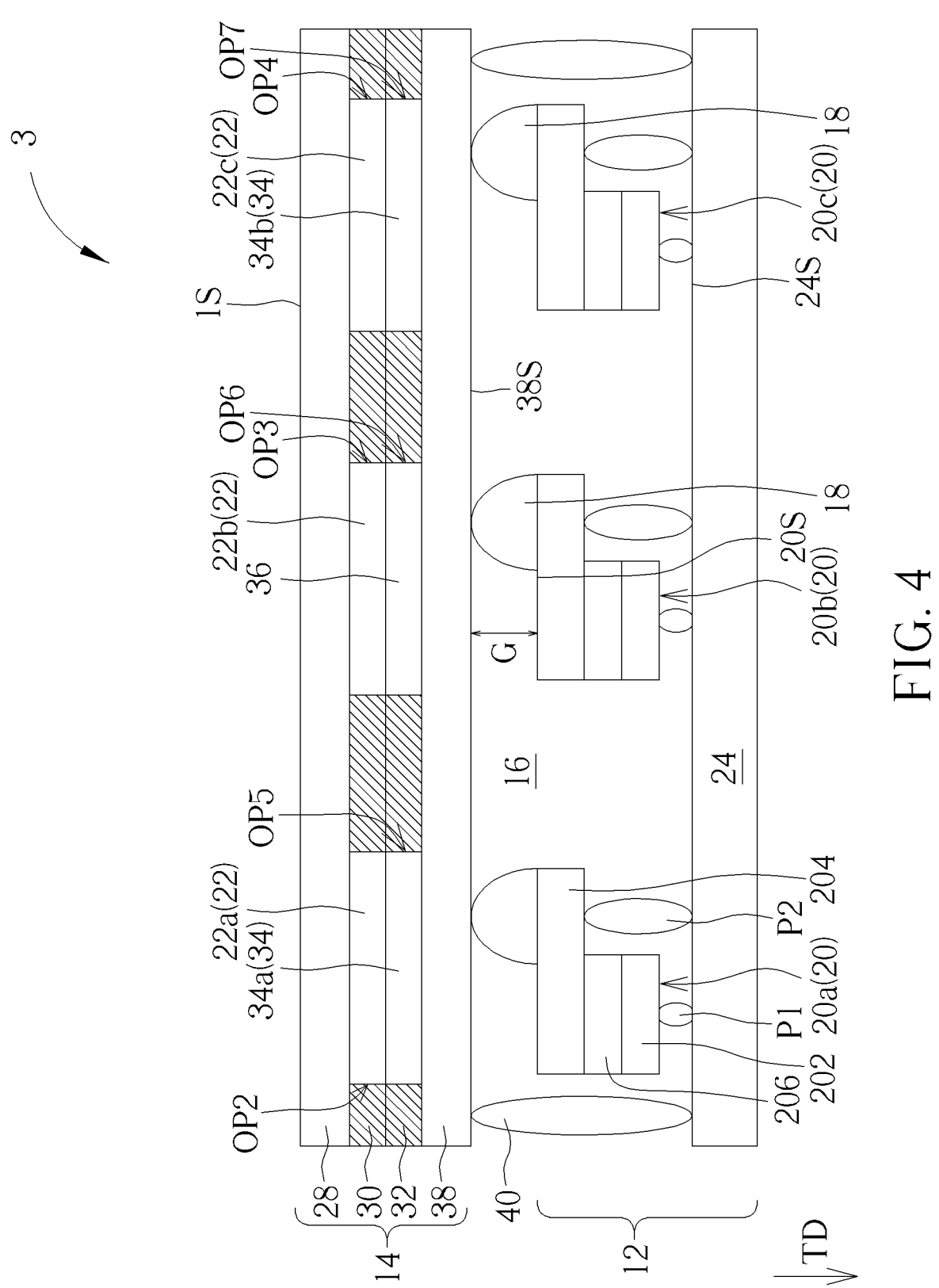
FIG. 4 is a schematic diagram illustrating a cross-sectional view of a display device according to a third embodiment of the present disclosure.

FIG. 4 is a schematic cross-sectional view of a display device according to the third embodiment of the present disclosure. As shown in FIG. 4, one of the differences between the display device 3 of the present embodiment and the display device 1 shown in FIG. 1 is that the first substrate 12 of the present embodiment does not include the light-shielding layer 26. It should be noted that when the resolution of the display device 3 reaches a certain level, the light-shielding layer 26 is not easily disposed between the light-emitting elements 20. Therefore, the display device 3 may not include the light-shielding layer 26. In this case, the spacers 18 may be disposed on the light-emitting elements 20. In the embodiment of FIG. 4, the distance G between the first substrate 12 and the second substrate 14 may be, for example, a distance between the lower surface 38S of the encapsulation layer 38 facing the first substrate 12 and the upper surface 20S of one of the light-emitting elements 20. The distance G may be, for example, greater than 0 μm and less than 5 μm(0 μm<distance G<5 μm). Other portions of the display device 3 shown in FIG. 4 may be, for example, the same as those of the display device 1 shown in FIG. 1, so the details are not repeated. The manufacturing method of the display device 3 shown in FIG. 4 may be similar to that shown in FIG. 2, and a difference between them is that the first substrate 12 in FIG. 4 does not include the light-shielding layer 26. Other steps may be the same as those of FIG. 1 and FIG. 2. In some embodiments, the light-emitting elements 20 in the display device 3 of FIG. 4 may adopt the light-emitting elements 20 of FIG. 3, so the light-shielding layer 32, the color conversion layer 34 and the transparent filling layer 36 shown in FIG. 1 may not be included. In some embodiments, the display device 3 may optionally not include the encapsulation layer 38.

Figure 5:
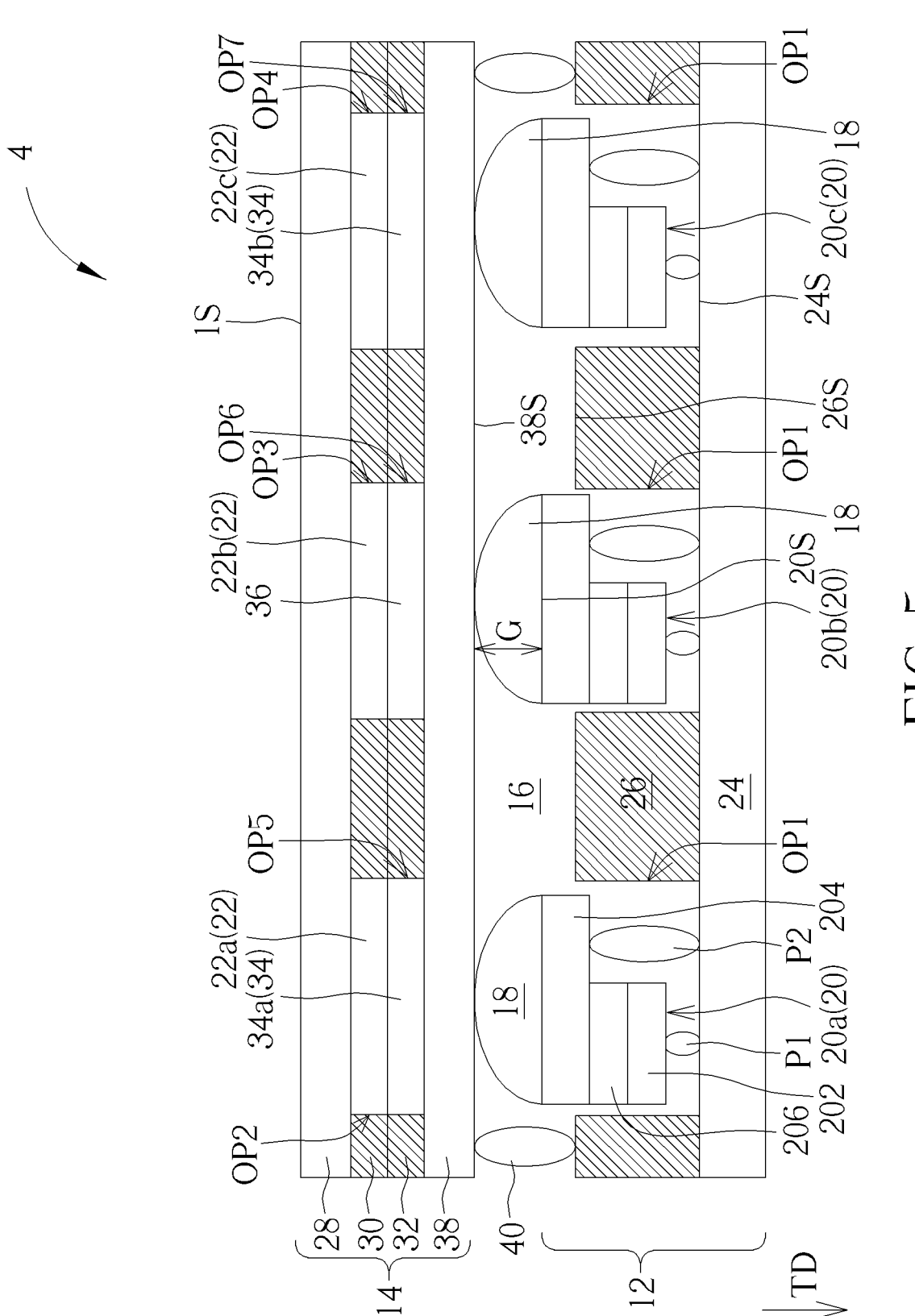
FIG. 5 is a schematic diagram illustrating a cross-sectional view of a display device according to a fourth embodiment of the present disclosure.

FIG. 5 is a schematic cross-sectional view of a display device according to a fourth embodiment of the present disclosure. As shown in FIG. 5, one of the differences between the display device 4 of the present embodiment and the display device 1 shown in FIG. 1 is that one of the spacers 18 disposed on one of the light-emitting elements 20 in the present embodiment may at least partially overlap the light-emitting layer 206 when viewed along the top view direction TD. In the embodiment of FIG. 5, the spacer 18 may cover the upper surface 20S of the light-emitting element 20 (e.g., the upper surface of the N-type semiconductor layer 204). It is noted that since the refractive index of the spacer 18 may be greater than that of the adhesive material 16 (e.g., may be between the refractive index of the N-type semiconductor layer 204 or the P-type semiconductor layer 202 and the refractive index of the adhesive material), the total reflection of the light emitted from the light-emitting element 20 that is generated between the light-emitting element 20 and the adhesive material 16 may be reduced, thereby improving the light extraction efficiency of the light-emitting element 20. In addition, the spacer 18 may be, for example, in a dome shape, such that the spacer 18 has an advantage of concentrating the light generated by the light-emitting element 20 upwardly, thereby reducing light mixing of adjacent light with different colors. In some embodiments, the visible light transmittance of the spacer 18 may be greater than or equal to 90%, and/or the haze of the spacer 18 may be less than or equal to 1%, which may reduce the influence of the spacer 18 on the light extraction efficiency (or external quantum efficiency, EQE)) of the light emitting element 20.

Other portions of the display device 4 shown in FIG. 5 may adopt, for example, the corresponding portions of the display device 1 shown in FIG. 1, and the manufacturing method of the display device 4 shown in FIG. 5 may be similar to or the same as that of FIG. 2, so the details are not repeated. In some embodiments, the light-emitting elements 20 in the display device 4 of FIG. 5 may adopt the light-emitting elements 20 of FIG. 3, so the display device 4 of FIG. 5 may not include the light-shielding layer 32, the color conversion layer 34 and the transparent filling layer 36 shown in FIG. 1. In some embodiments, the display device 4 may optionally not include the encapsulation layer 38.

Figure 6:
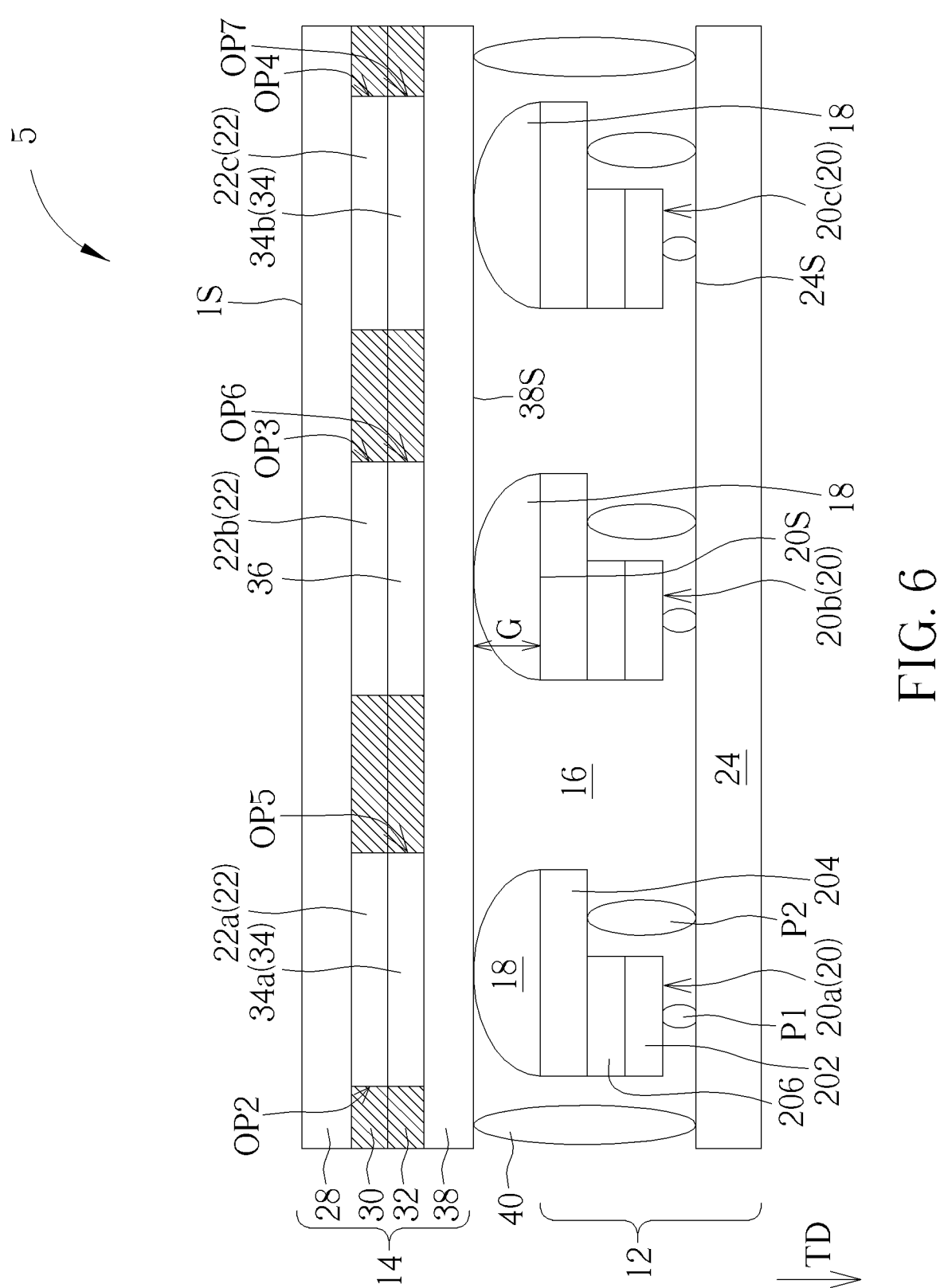
FIG. 6 is a schematic diagram illustrating a cross-sectional view of a display device according to a fifth embodiment of the present disclosure.

FIG. 6 is a schematic cross-sectional view of a display device according to a fifth embodiment of the present disclosure. As shown in FIG. 6, one of the differences between the display device 5 of the present embodiment and the display device 4 in FIG. 5 is that the first substrate 12 of the present embodiment may not include the light-shielding layer 26, which is similar to the display device 3 shown in FIG. 4. In the embodiment of FIG. 6, the distance G between the first substrate 12 and the second substrate 14 may be, for example, the distance between the lower surface 38S of the encapsulation layer 38 facing the first substrate 12 and the upper surface 20S of one of the light-emitting elements 20. Other portions of the display device 5 shown in FIG. 6 may adopt, for example, those corresponding portions of the display device 1 shown in FIG. 1, so the details are not repeated. The manufacturing method of the display device 5 shown in FIG. 6 may be similar to that of FIG. 2, the difference between them is that the first substrate 12 in FIG. 6 does not include the light-shielding layer 26, and other steps may be the same as those shown in FIG. 1 and FIG. 2. In some embodiments, the light-emitting elements 20 in the display device 5 of FIG. 6 may adopt the light-emitting elements 20 of FIG. 3, so the display device 5 of FIG. 6 may not include the light-shielding layer 32, the color conversion layer 34 and the transparent filling layer 36 shown in FIG. 1. In some embodiments, the display device 5 may optionally not include the encapsulation layer 38.

Figure 7:
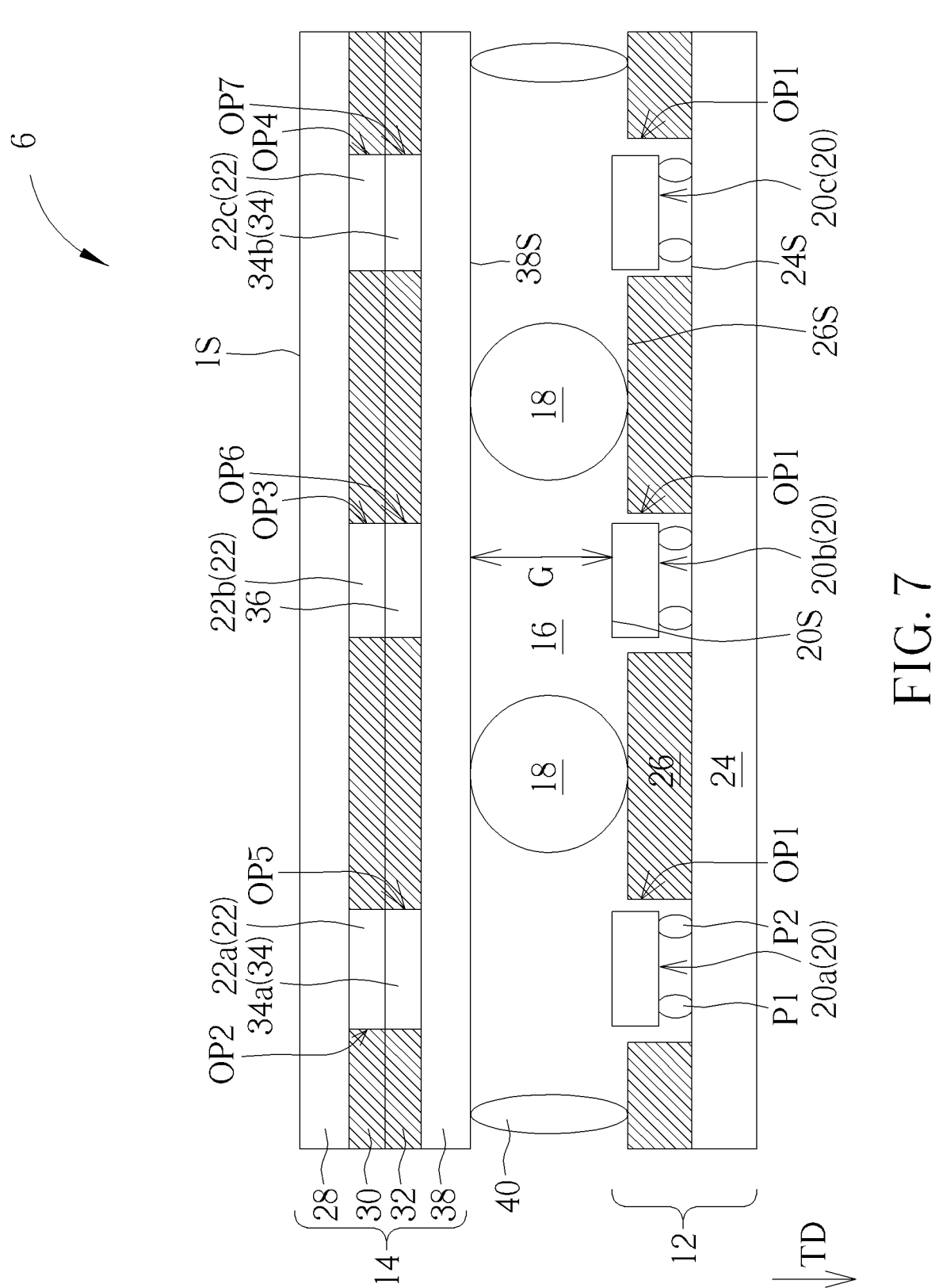
FIG. 7 is a schematic diagram illustrating a cross-sectional view of a display device according to a sixth embodiment of the present disclosure.

FIG. 7 is a schematic cross-sectional view of a display device according to a sixth embodiment of the present disclosure. As shown in FIG. 7, one of the differences between the display device 6 of the present embodiment and the display device 1 shown in FIG. 1 is that the spacers 18 of the present embodiment are in granular shapes. In other words, the spacers 18 may be disposed on the first substrate 12, for example, by spreading. In some embodiments, the granular spacers 18 may include, for example, a glass-based material or a resin-based material, but not limited thereto. In the embodiment of FIG. 7, the spacers 18 may be disposed on the light-shielding layer 26. In some embodiments, two of the spacers 18 may be respectively disposed on the light-shielding layer 26 and the light-emitting element 20, or one of the spacers 18 may be disposed on both the light-shielding layer 26 and one of the light-emitting elements 20, but not limited thereto. In this case, the visible light transmittance of one of the spacers 18 may be, for example, greater than or equal to 90%, and/or the haze of the spacer 18 may be less than or equal to 1%, which reduces the influence of the spacers 18 on the light extraction efficiency of the light-emitting elements 20. In some embodiments, a distribution density range of the spacers 18 may be, for example, about 0.01% to 0.15%(0.01%≤distribution density≤0.15%) and may be, for example, determined according to requirements of product design. The distribution density of the present disclosure may be a total area of all the spacers 18 viewed along the top view direction TD divided by an area of a display region of the display device 6 (that is, the total area of all the spacers 18/the area of the display region). The display region of the display device 6 may be, for example, determined by a distribution range of the light-emitting elements 20. In some embodiments, particle sizes of the spacers 18 may be, for example, 1 μm to 600 μm or 1 μm to 5 μm(1 μm≤particle size≤600 μm or 1 μm particle size≤5 μm) and may be determined, for example, according to optical requirements. The light-emitting elements 20 of FIG. 7 may adopt, for example, the same as or similar to the light emitting elements 20 shown in FIG. 1 or other types of light-emitting elements. Other portions of the display device 6 shown in FIG. 7 may adopt, for example, those corresponding portions of the display device 1 shown in FIG. 1, so the details are not repeated. The manufacturing method of the display device 6 of FIG. 7 may be similar to that of FIG. 2, the differences between them are that the spacers 18 of FIG. 7 are disposed on the first substrate 12 or the second substrate 14 by spreading, and the spacers 18 are cured before attaching the first substrate 12 and the second substrate 14 to each other, while other steps may be the same as the manufacturing methods shown in FIG. 1 and FIG. 2, so the details are not repeated. In some embodiments, the light-emitting elements 20 in the display device 6 of FIG. 7 may adopt the light-emitting elements 20 of FIG. 3, so the display device 6 of FIG. 7 may not include the light-shielding layer 32, the color conversion layer 34 and the transparent filling layer 36 shown in FIG. 1. In some embodiments, the display device 6 may optionally not include the encapsulation layer 38.

Figure 8:
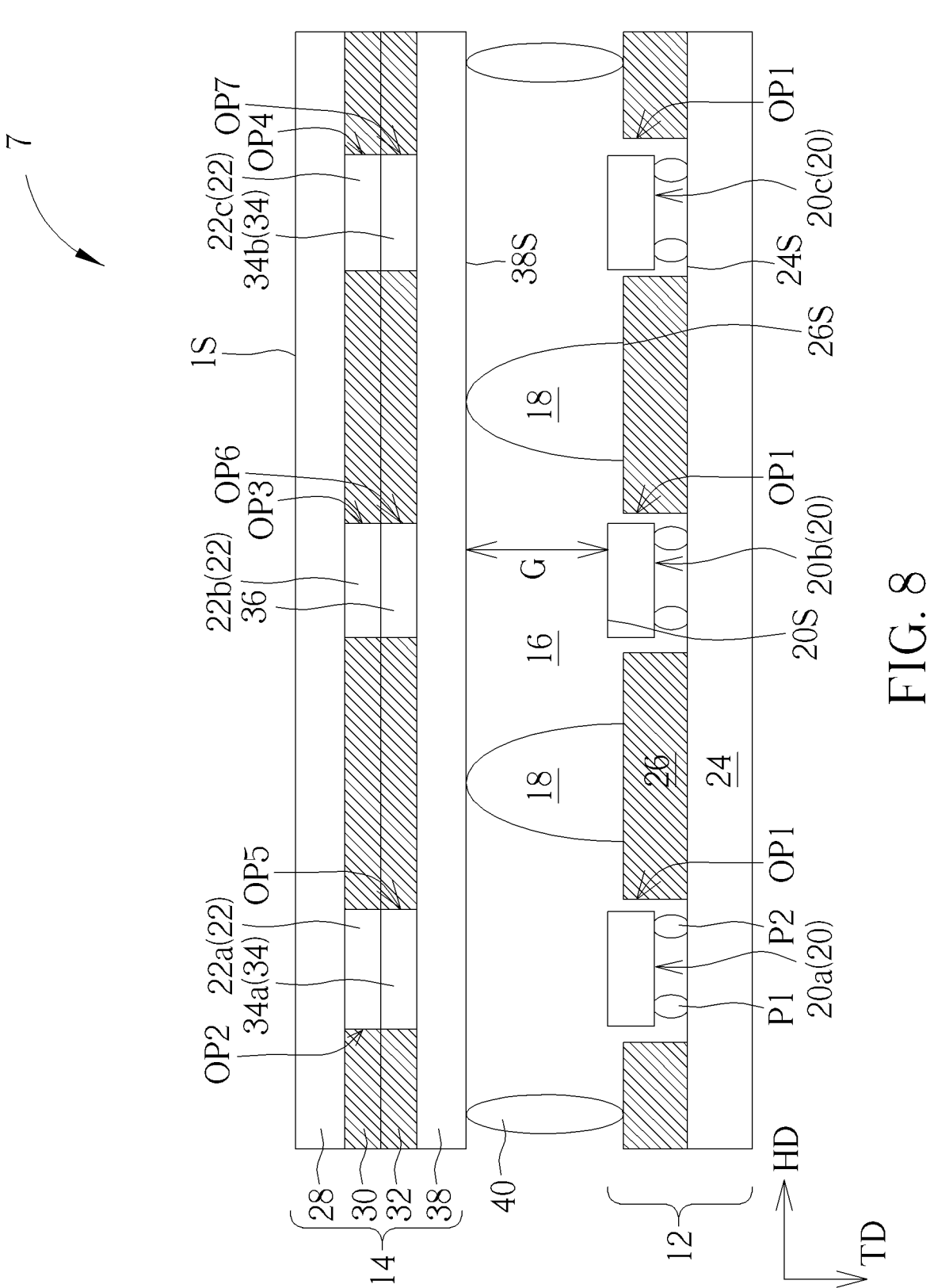
FIG. 8 is a schematic diagram illustrating a cross-sectional view of a display device according to a seventh embodiment of the present disclosure.

FIG. 8 is a schematic cross-sectional view of a display device according to a seventh embodiment of the present disclosure. As shown in FIG. 8, one of the differences between the display device 7 of the present embodiment and the display device 1 shown in FIG. 1 is that one of the spacers 18 of the present embodiment may be formed on the light-shielding layer 26 of the first substrate 12. For example, the spacer 18 may be formed on the light-shielding layer 26 by photolithography and etching processes, a printing process or other suitable processes. The spacer 18 may include, for example, a photosensitive resin, an ink or other suitable materials. Since the spacer 18 is disposed on the light-shielding layer 26 instead of the light-emitting elements 20, the transmittance of the spacer 18 does not require to be limited in a specific range. In some embodiments, the spacer 18 may include, for example, a light-shielding material to reduce light mixing of adjacent light-emitting elements 20. In some embodiments, a width of the spacer 18 in a horizontal direction HD perpendicular to the top view direction TD may gradually decrease as a distance between the width of the spacer 18 and the upper surface 26S of the light-shielding layer 26 gradually increases. In other words, the width of a bottom of the spacer 18 adjacent to the light-shielding layer 26 is greater than the width of a top of the spacer 18 adjacent to the second substrate 14.

The light-emitting elements 20 of FIG. 8 may be, for example, the same as or similar to the light-emitting elements 20 shown in FIG. 1 or other types of light-emitting elements. Other portions of the display device 7 shown in FIG. 8 may adopt, for example, corresponding portions of the display device 1 shown in FIG. 1, so the details are not repeated. The manufacturing method of the display device 7 of FIG. 8 may be similar to that of FIG. 2, and the difference between them is that the spacers 18 of FIG. 8 are formed on the light-shielding layer 26, while other steps may be the same as those shown in FIG. 1 and FIG. 2. The details are not repeated. In some embodiments, the light-emitting elements 20 in the display device 7 of FIG. 8 may adopt the light-emitting elements 20 of FIG. 3, so the display device 7 of FIG. 8 may not include the light-shielding layer 32, the color conversion layer 34 and the transparent filling layer 36 shown in FIG. 1. In some embodiments, the display device 7 may optionally not include the encapsulation layer 38.

Figure 9:
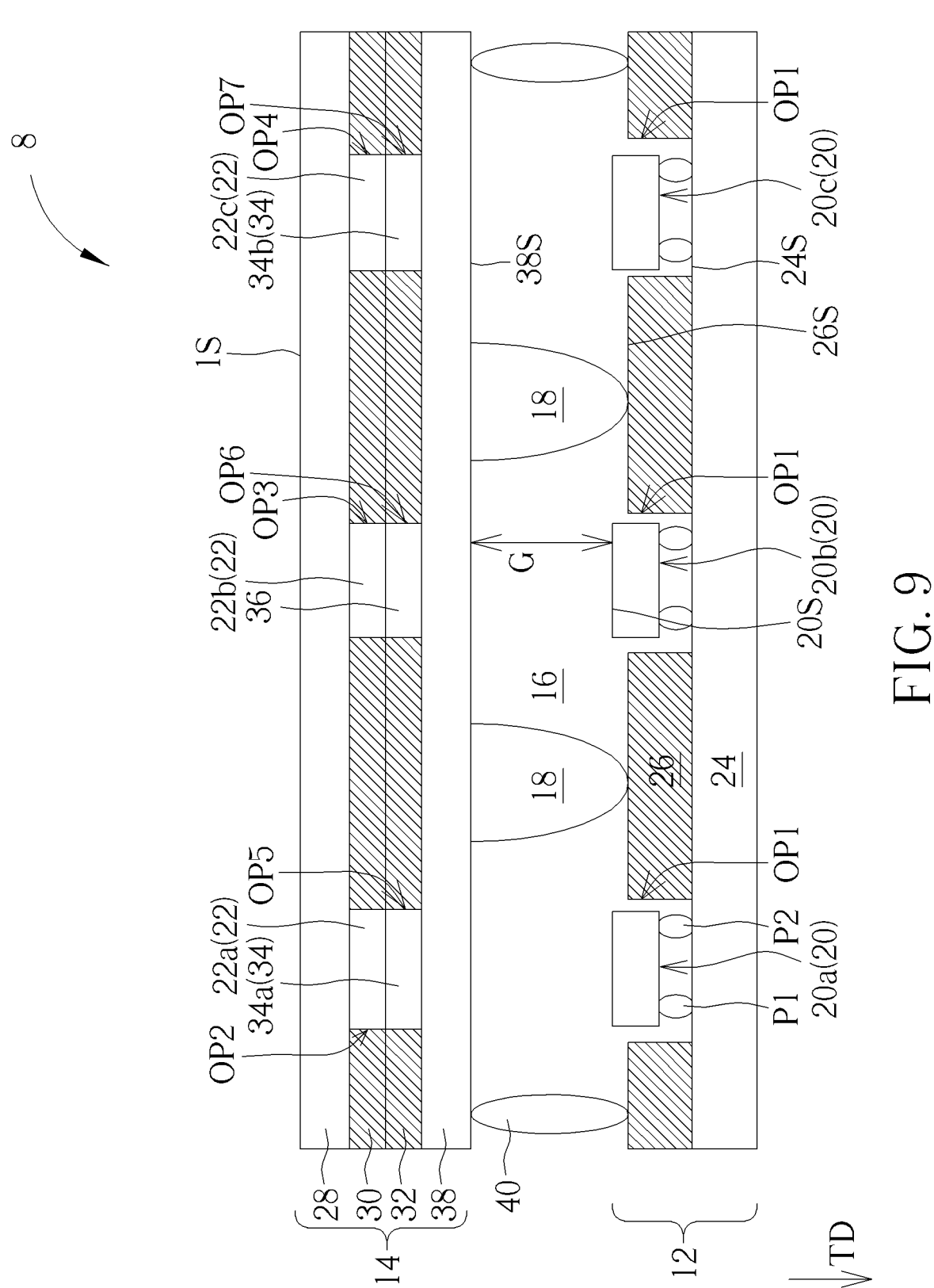
FIG. 9 is a schematic diagram illustrating a cross-sectional view of a display device according to an eighth embodiment of the present disclosure.

FIG. 9 is a schematic cross-sectional view of a display device according to an eighth embodiment of the present disclosure. As shown in FIG. 9, one of the differences between the display device 8 of the present embodiment and the display device 7 shown in FIG. 8 is that one of the spacers 18 of the present embodiment is formed on the light-shielding layer 30 of the second substrate 14. For example, the spacer 18 may be formed on the encapsulation layer 38 by photolithography and etching processes, an inkjet printing process or other suitable processes. In the embodiment of FIG. 9, the spacer 18 may overlap the light-shielding layer 30 or the light-shielding layer 32 when viewed along the top view direction TD. In some embodiments, the spacer 18 may include, for example, a light-shielding material to reduce light mixing of adjacent light-emitting elements 20. In some embodiments, the width of the spacer 18 in the horizontal direction HD may gradually decrease as the distance between the width of the spacer 18 and the lower surface of the encapsulation layer 38 gradually increases. In other words, the width of the bottom of the spacer 18 adjacent to the encapsulation layer 38 is greater than the width of the top of the spacer 18 adjacent to the first substrate 12. The light-emitting elements 20 of FIG. 9 may be, for example, the same as or similar to the light-emitting elements 20 shown in FIG. 1 or other types of light-emitting elements. Other portions of the display device 8 shown in FIG. 9 may adopt, for example, corresponding portions of the display device 1 shown in FIG. 1, so the details are not repeated.

Figure 10:
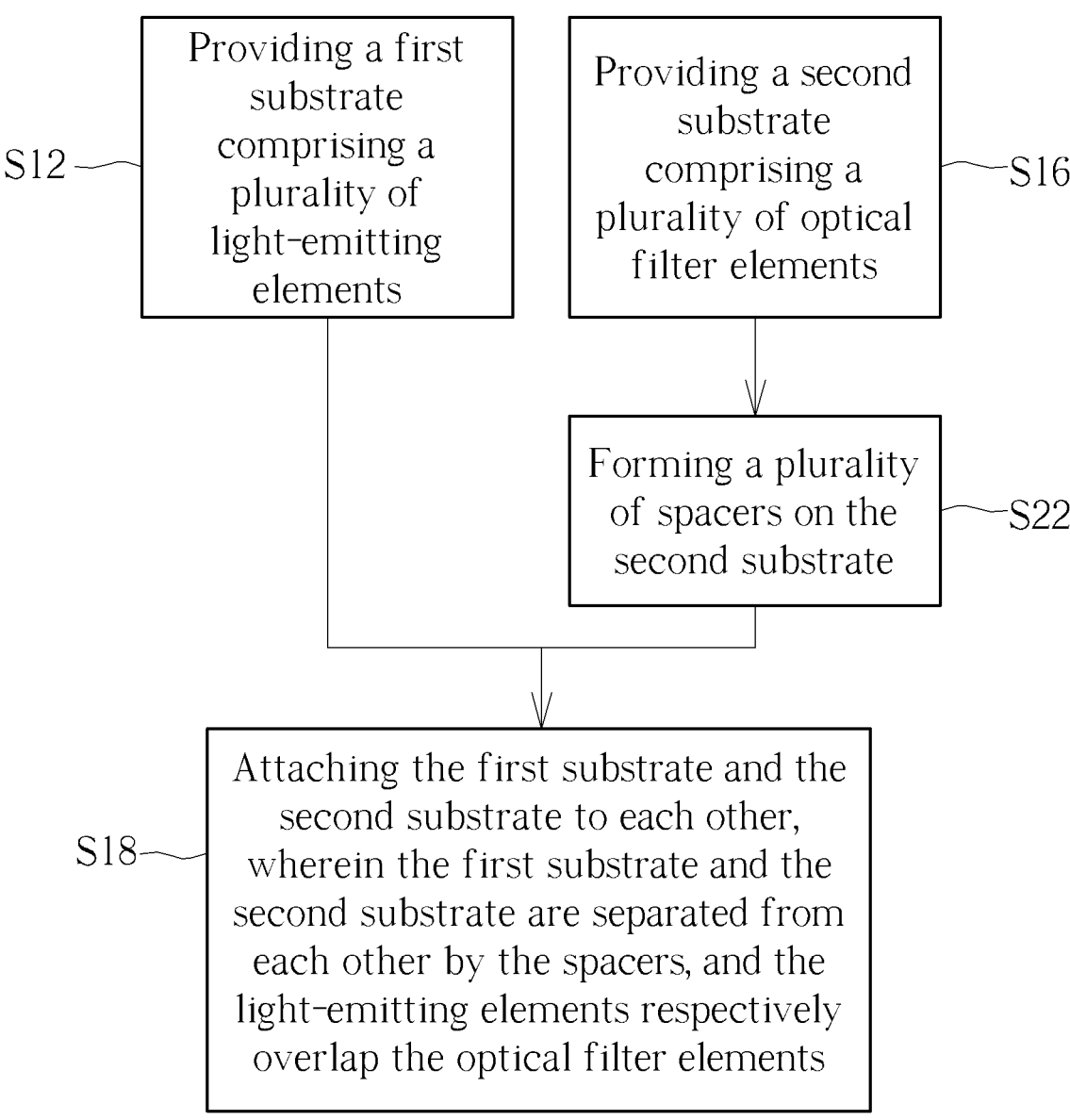
FIG. 10 is a flowchart of a manufacturing method of a display device according to some embodiments of the present disclosure.

Please refer to FIG. 10, which is a flowchart of a manufacturing method of a display device according to some embodiments of the present disclosure. As shown in FIG. 10, the manufacturing method of the display device may include, for example, step S12, step S16, step S18 and step S22. As shown in FIG. 9 and FIG. 10, in step S12, the first substrate 12 is provided. In step S16, the second substrate 14 is provided. Since step S12 and step S16 may be similar to or the same as step S12 and step S16 in FIG. 1 and FIG. 2, respectively, the details are not repeated. After step S16, step S22 may be performed to form a plurality of spacers 18 on the second substrate 14. The spacers 18 may be formed on the second substrate 14, for example, by photolithography and etching processes, a printing process or other suitable processes, wherein the printing process may include, for example, inkjet printing. When the spacers 18 are formed through the printing process, the spacers 18 may be cured after the printing process. Since the material of the spacers 18 may be the same as or similar to that of the spacers 18 shown in FIG. 1 and FIG. 2, the details are not repeated.

Since step S12 does not affect the progress of step S16 and step S22, step S12 may be performed before or after step S16 and step S22, or step S12 may be performed simultaneously with at least one of step S16 and step S22, but not limited thereto. After step S12 of providing the first substrate 12 and step S22 of forming the spacers 18, step S18 may be performed to attach the first substrate 12 and the second substrate 14 having the spacers 18 formed thereon, such that the first substrate 12 and the second substrate 14 may be separated from each other by the spacers 18 during attaching, thereby forming the display device 8. Step S18 may be similar to or the same as step S18 in FIG. 1 and FIG. 2, respectively, so the details are not repeated.

In some embodiments, the light-emitting elements 20 in the display device 8 of FIG. 9 may adopt the light-emitting elements 20 of FIG. 3, so the display device 8 of FIG. 9 may not include the light-shielding layer 32, the color conversion layer 34 and the transparent filling layer 36 shown in FIG. 1. In some embodiments, the display device 8 may optionally not include the encapsulation layer 38. In this case, the spacers 18 may be formed on the light-shielding layer 30.

In summary, in the display device and the manufacturing method thereof of the present disclosure, the spacers are disposed between the first substrate and the second substrate and separate the first substrate from the second substrate, such that the distance between the first substrate and the second substrate may be uniformized, thereby improving the display quality.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A manufacturing method of a display device, comprising:

providing a first substrate, wherein the first substrate comprises a plurality of light-emitting elements;

providing a second substrate, wherein the second substrate comprises a plurality of optical filter elements;

forming a plurality of spacers on the first substrate or the second substrate by a printing process; and attaching the first substrate and the second substrate to each other through an adhesive material between the first substrate and the second substrate, wherein the first substrate and the second substrate are separated from each other by the plurality of spacers, the plurality of spacers are respectively disposed on a plurality of the plurality of the light-emitting elements, and the plurality of light-emitting elements respectively overlap the plurality of optical filter elements, wherein one of the plurality of light-emitting elements comprises an N-type semiconductor layer, a P-type semiconductor layer and a light-emitting layer between the N-type semiconductor layer and the P-type semiconductor layer, and one of the plurality of spacers is disposed on the one of the plurality of light-emitting elements and does not overlap the light-emitting layer.

2. The manufacturing method of claim 1, wherein the printing process is an inkjet printing process.

3. The manufacturing method of claim 1, wherein the one of the plurality of spacers is in a dome shape.

4. The manufacturing method of claim 3, wherein the one of the plurality of spacers has a maximum height and a maximum width, and a ratio of the maximum width to the maximum height ranges from 0.3 to 8.

5. The manufacturing method of claim 1, wherein a haze of the one of the plurality of spacers is less than or equal to 1%.

6. The manufacturing method of claim 1, wherein a visible light transmittance of the one of the plurality of spacers is greater than or equal to 90%.

7. A display device, comprising:

a first substrate comprising a plurality of light-emitting elements;

a second substrate comprising a plurality of optical filter elements, wherein the plurality of optical filter elements respectively overlap the plurality of light-emitting elements;

an adhesive material disposed between the first substrate and the second substrate; and a plurality of spacers respectively disposed on a plurality of the plurality of the light-emitting elements, wherein the first substrate and the second substrate are separated by the plurality of spacers, wherein one of the plurality of light-emitting elements comprises an N-type semiconductor layer, a P-type semiconductor layer and a light-emitting layer between the N-type semiconductor layer and the P-type semiconductor layer, and one of the plurality of spacers is disposed on the one of the plurality of light-emitting elements and does not overlap the light-emitting layer.

8. The display device of claim 7, wherein one of the plurality of spacers is in a dome shape.

9. The display device of claim 8, wherein the one of the plurality of spacers has a maximum height and a maximum width, and a ratio of the maximum width to the maximum height ranges from 0.3 to 8.

10. The display device of claim 8, wherein a maximum height of the one of the plurality of spacers ranges from 0.1 μm to 300 μm.

11. The display device of claim 8, wherein a maximum width of the one of the plurality of spacers ranges from 0.1 μm to 300 μm.

12. The display device of claim 7, wherein a visible light transmittance of one of the plurality of spacers is greater than or equal to 90%.

13. The display device of claim 7, wherein a haze of one of the plurality of spacers is less than or equal to 1%.

14. The display device of claim 7, wherein a refractive index of one of the plurality of spacers is greater than a refractive index of the adhesive material.

15. A display device, comprising:

a first substrate comprising a plurality of light-emitting elements;

a second substrate comprising a plurality of optical filter elements, wherein the plurality of optical filter elements respectively overlap the plurality of light-emitting elements;

a plurality of spacers disposed between the first substrate and the second substrate; and an adhesive material disposed between the first substrate and the second substrate;

wherein one of the plurality of spacers has a maximum height and a maximum width, and at least one of the maximum height and the maximum width ranges from 0.1 μm to 300 μm, wherein one of the plurality of light-emitting elements comprises an N-type semiconductor layer, a P-type semiconductor layer and a light-emitting layer between the N-type semiconductor layer and the P-type semiconductor layer, and the one of the plurality of spacers is disposed on the one of the plurality of light-emitting elements and does not overlap the light-emitting layer.

* * * * *